United States Patent
Mounioloux

(10) Patent No.: US 10,048,008 B1
(45) Date of Patent: Aug. 14, 2018

(54) RADIATOR WITH INTEGRATED PUMP FOR ACTIVELY COOLING ELECTRONIC DEVICES

(75) Inventor: Stephen Mounioloux, Long Beach, CA (US)

(73) Assignee: Rouchon Industries, Inc., Long Beach, CA (US)

( * ) Notice: Subject to any disclaimer, the term of this patent is extended or adjusted under 35 U.S.C. 154(b) by 830 days.

(21) Appl. No.: 12/969,284

(22) Filed: Dec. 15, 2010

Related U.S. Application Data

(60) Provisional application No. 61/286,571, filed on Dec. 15, 2009.

(51) Int. Cl.
| | | |
|---|---|---|
| F28D 1/04 | (2006.01) | |
| H01L 23/473 | (2006.01) | |
| F28D 1/053 | (2006.01) | |
| F28D 21/00 | (2006.01) | |

(52) U.S. Cl.
CPC .......... *F28D 1/04* (2013.01); *F28D 1/05341* (2013.01); *F28D 1/05366* (2013.01); *F28D 1/05391* (2013.01); *H01L 23/473* (2013.01); *F28D 2021/0031* (2013.01); *F28F 2250/08* (2013.01)

(58) Field of Classification Search
CPC .......... H01L 23/473; F28D 2021/0031; F28D 1/05341; F28D 1/05366; F28D 1/05391; F28D 1/04; F28F 2250/08
USPC .......... 165/80.4, 71; 361/699; 415/175–178; 417/423.15
See application file for complete search history.

(56) References Cited

U.S. PATENT DOCUMENTS

| | | | |
|---|---|---|---|
| 4,834,628 A | * | 5/1989 | Laing .............. F04D 29/20 417/420 |
| 5,316,077 A | * | 5/1994 | Reichard ............ 165/104.28 |
| 5,731,954 A | | 3/1998 | Cheon |
| 6,019,165 A | | 2/2000 | Batchelder |
| 6,196,003 B1 | | 3/2001 | Macias et al. |
| 6,234,240 B1 | | 5/2001 | Cheon |
| 6,263,957 B1 | | 7/2001 | Chen et al. |
| 6,408,630 B2 | | 6/2002 | Macias et al. |
| 6,856,509 B2 | | 2/2005 | Lin |
| 7,113,404 B2 | * | 9/2006 | Naganawa et al. ...... 361/699 |
| 2003/0131974 A1 | | 7/2003 | Ellison et al. |

(Continued)

FOREIGN PATENT DOCUMENTS

EP 0584850 * 3/1994 ............... F01P 3/20

*Primary Examiner* — Len Tran
*Assistant Examiner* — Eric Ruppert
(74) *Attorney, Agent, or Firm* — Waller Lansden Dortch & Davis, LLP; Matthew C. Cox

(57) ABSTRACT

An integrated cooling system for actively cooling one or more electronic components in an electronic device such as a computer is provided. The cooling system includes a radiator and a pump integrally attached to the radiator. The pump can include a pump housing having an upper pump housing member attached to the radiator and a lower pump housing member detachably securable to the upper pump housing member. The cooling system includes a flow inlet and a flow outlet for attaching hoses or conduits to the radiator for actively moving a liquid coolant to and from an external cooling block or cooling plate. The external cooling block or cooling plate can be attached to the electronic component to be cooled, such as a computer graphics card, microprocessor or other circuit component.

20 Claims, 8 Drawing Sheets

(56) References Cited

U.S. PATENT DOCUMENTS

| | | | |
|---|---|---|---|
| 2005/0088820 A1* | 4/2005 | Naganawa | F28D 1/05341 361/697 |
| 2005/0168939 A1* | 8/2005 | Iijima | F28D 1/05375 361/679.47 |
| 2006/0018775 A1* | 1/2006 | Oikawa | F04B 53/08 417/423.14 |
| 2006/0051222 A1* | 3/2006 | Lee et al. | 417/423.14 |
| 2007/0034353 A1* | 2/2007 | Liu et al. | 165/80.4 |
| 2007/0227698 A1* | 10/2007 | Conway et al. | 165/80.4 |
| 2008/0105407 A1* | 5/2008 | Yeh et al. | 165/104.28 |
| 2008/0128114 A1* | 6/2008 | Lai et al. | 165/80.4 |
| 2008/0169086 A1* | 7/2008 | Hu | F28D 1/05366 165/80.4 |
| 2009/0044929 A1* | 2/2009 | Yeh et al. | 165/104.19 |

\* cited by examiner

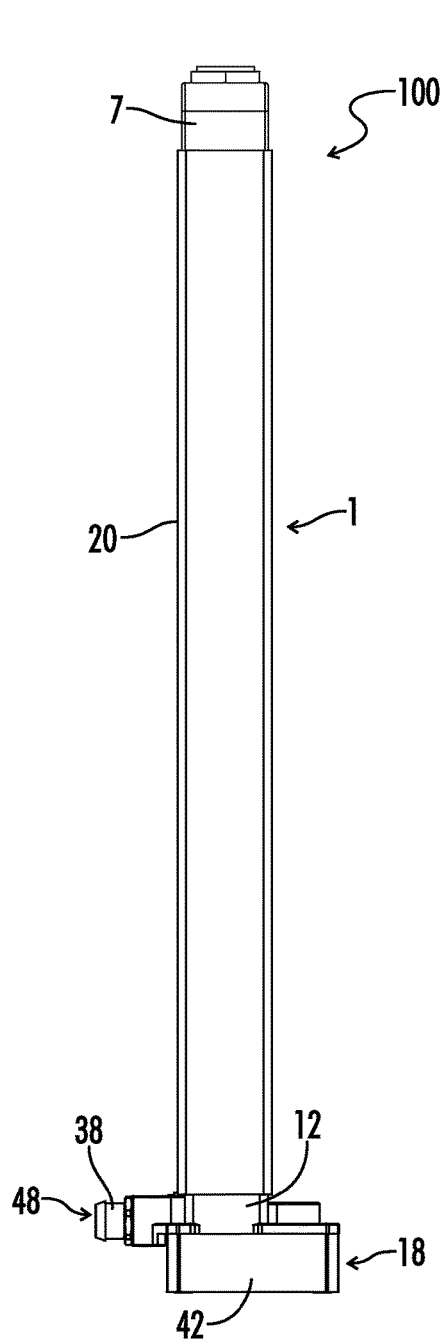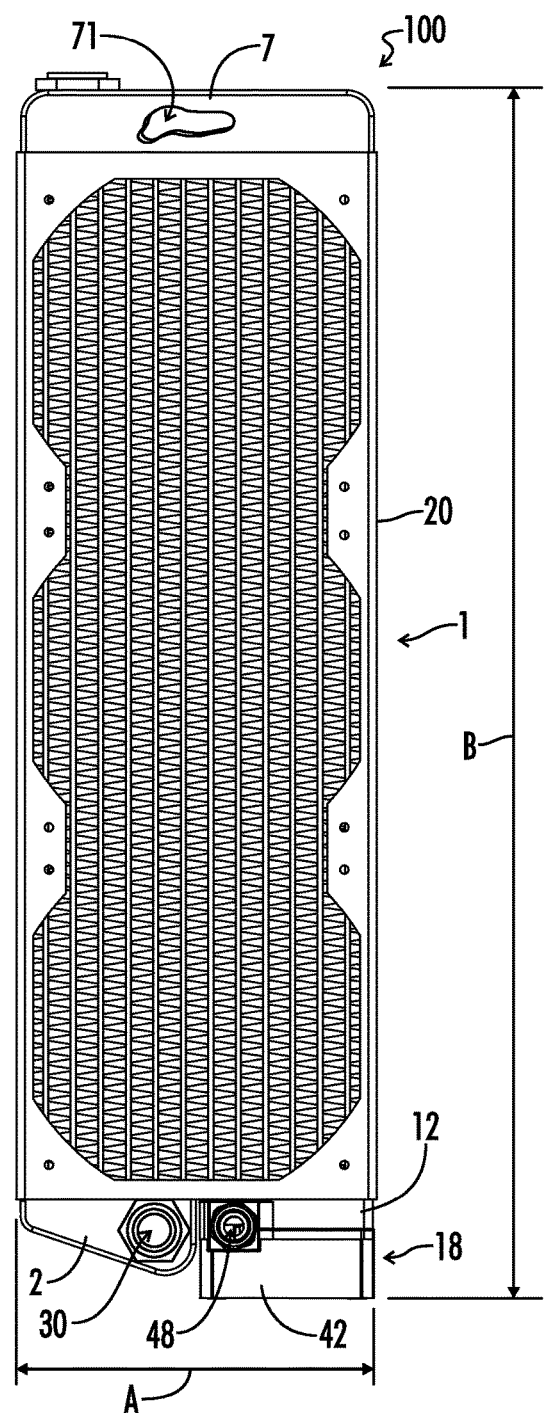
FIG. 7
FIG. 8

RADIATOR WITH INTEGRATED PUMP FOR ACTIVELY COOLING ELECTRONIC DEVICES

CROSS-REFERENCES TO RELATED APPLICATIONS

This application is a Non-Provisional Utility Patent Application which claims the benefit of U.S. Provisional Patent Application having Ser. No. 61/286,571 filed Dec. 15, 2009 by Applicant Stephen Mouniouloux of Long Beach, Calif., entitled "A Radiator with Integrated Pump for Water Cooled Computer Systems," which is hereby incorporated by reference in its entirety.

BACKGROUND OF THE INVENTION

Technical Field

The present invention relates generally to active cooling systems and more particularly to liquid heat exchanger systems for removing heat from electronic components and devices.

Background Art

Consumer electronic devices such as personal computers commonly utilize microprocessors and other circuit components that generate heat. Such circuit components can include for example central processing units, video graphics processing units, chip sets and memory modules. During use, heat generated within these circuit components must be removed to avoid both damage to the electronic device and reduction in device performance.

Conventional active cooling systems have been developed to extract heat from circuit components in electronic device applications such as personal computers. Such conventional active cooling systems can include the use of fans mounted on or near a circuit component to force air across the circuit component or across a heat exchanger mounted to the circuit component. Forced convection can transfer heat away from the circuit component in these conventional systems. Another conventional active cooling system includes the use of a closed-loop fluid circuit including a cooling fluid, a fluid reservoir, a pump, a heat exchanger or radiator and a contact block. The contact block generally includes the region where the cooling fluid engages in thermal contact with the heat generating circuit component, i.e. a central processing unit, microprocessor, graphics card, etc. Also, in such conventional systems, movement of the cooling fluid through the closed-loop system is provided by an external pump.

In many applications, the space surrounding the circuit component to be cooled inside the electronic device does not provide adequate room for a closed-loop active liquid cooling system. Thus, it may be necessary to position one or more cooling system components outside the electronic device housing where there is sufficient space. This type of system can be referred to as remote cooling.

One problem associated with conventional active remote cooling systems of this nature involves the use of numerous individual components. For example, some conventional systems include a pump coupled to a reservoir, a heat exchanger, and a contact block engaging the circuit feature to be cooled, wherein each system component is connected by one or more conduits or hoses. This type of system requires at least three connection hoses—an outlet hose extending from the heat exchanger to the pump, a delivery hose extending from the pump to the contact block, and an inlet hose extending from the contact block back to the heat exchanger. Each hose end must be securely connected to a system component, leading to at least six hose connection locations. Such conventional designs requiring three hoses and a standalone pump undesirably add complexity and potential leakage locations to the active cooling system.

Another problem associated with some conventional active liquid cooling systems for electronic devices includes the placement of the inlet and outlet orifices in the heat exchanger. For example, U.S. Pat. No. 6,234,240 to Cheon teaches a fanless cooling system for a computer having a reservoir with an inlet opening generally positioned at a higher elevation than the exit opening. By positioning an opening in the reservoir at a relatively high elevation on the electronic device, such conventional devices create an enhanced possibility of damage to circuit components if a leak should develop at the elevated opening position during use.

Another problem associated with conventional active liquid cooling systems for electronic devices is placement of all cooling system components inside the electronic device. Such internal system component placement can require disassembly of the electronic device if replacement, repair or alteration of any individual component is necessary. Disassembly of the electronic device in such instances can be time consuming and costly and can increase the likelihood of damage to other system components or the electronic device itself during disassembly.

What is needed then are additional improvements in the devices and associated methods of actively cooling circuit components in electronic devices using closed loop liquid circulation systems.

BRIEF SUMMARY

One embodiment of the present invention provides an integrated cooling apparatus for actively cooling one or more computer components using a liquid coolant. The apparatus includes a radiator having an integrated pump attached to the radiator, wherein the radiator and the integrated pump form a one-piece unit. The radiator includes a radiator housing having first and second longitudinal tubes defining a tube gap between the first and second longitudinal tubes. The first longitudinal tube includes a first flow direction, and the second longitudinal tube includes a second flow direction. In some embodiments, the first and second flow directions are substantially opposite. A plurality of heat exchanger fins is transversely disposed across the tube gap between the first and second longitudinal tubes.

Another embodiment of the present invention provides a heat exchanger apparatus for removing heat from an electronic device using a liquid coolant. The apparatus includes a radiator operable to receive the liquid coolant, the radiator including first and second longitudinal tubes, and the radiator including a flow inlet. The apparatus also includes a plurality of heat exchanger fins positioned adjacent the first and second longitudinal tubes. A plenum defining a plenum cavity is disposed between the first and second longitudinal tubes. A pump housing is attached to the radiator, and the pump housing includes an upper pump housing member and a lower pump housing member. The upper pump housing member defines a flow outlet positioned for ejecting liquid coolant from the radiator. A collection reservoir is disposed below the second longitudinal tube, and an outlet chamber is positioned between the collection reservoir and the flow outlet. A reservoir wall is disposed in the pump housing between the collection reservoir and the outlet chamber. The reservoir wall defines a port hole therein positioned for allowing passage of liquid coolant from the collection reservoir to the outlet chamber.

A further embodiment of the present invention provides a heat exchanger apparatus for actively cooling a circuit component in a computer. The apparatus includes a radiator including a flow inlet. The radiator also includes a first plurality of longitudinal tubes defining a first flow direction and a second plurality of longitudinal tubes defining a second flow direction. A plurality of heat exchanger fins extend between adjacent longitudinal tubes. A pump is integrally disposed on the radiator, and the pump includes a pump housing defining a flow outlet and a collection reservoir positioned between the second plurality of longitudinal tubes and the flow outlet. The pump housing defines an outlet chamber disposed between the collection reservoir and the flow outlet.

It is therefore a general object of the invention to provide a heat exchanger apparatus having an integrated pump for providing a one-piece cooling apparatus that can be used interchangeably with different cooling blocks.

Another object of the present invention is to provide a heat exchanger apparatus with an integral reservoir for reducing the number of components of the cooling system.

A further object of the present invention is to provide an active cooling system for removing heat from a circuit component of an electronic device requiring only a cooling block and a heat exchanger with an integral pump, wherein only two hoses are required for creating a closed loop system.

Yet another object of the present invention is to provide a heat exchanger apparatus with an integral pump that can be mounted on the exterior or interior of a computer enclosure.

An additional object of the present invention is to provide a heat exchanger apparatus with an integral two-part pump housing including an upper pump housing member integrally attached to a radiator and a detachable lower pump housing member that can be removed for accessing the pump housing interior.

Numerous other objects, features and advantages of the present disclosure will be readily apparent to those skilled in the art upon a reading of the following description when taken in conjunction with the accompanying drawings.

BRIEF DESCRIPTION OF THE DRAWINGS

FIG. 7 illustrates a side view of an embodiment of an integrated cooling apparatus in accordance with the present invention.

FIG. 8 illustrates a front elevation view of the embodiment of an integrated cooling apparatus of FIG. 7.

DETAILED DESCRIPTION

Figure 1:
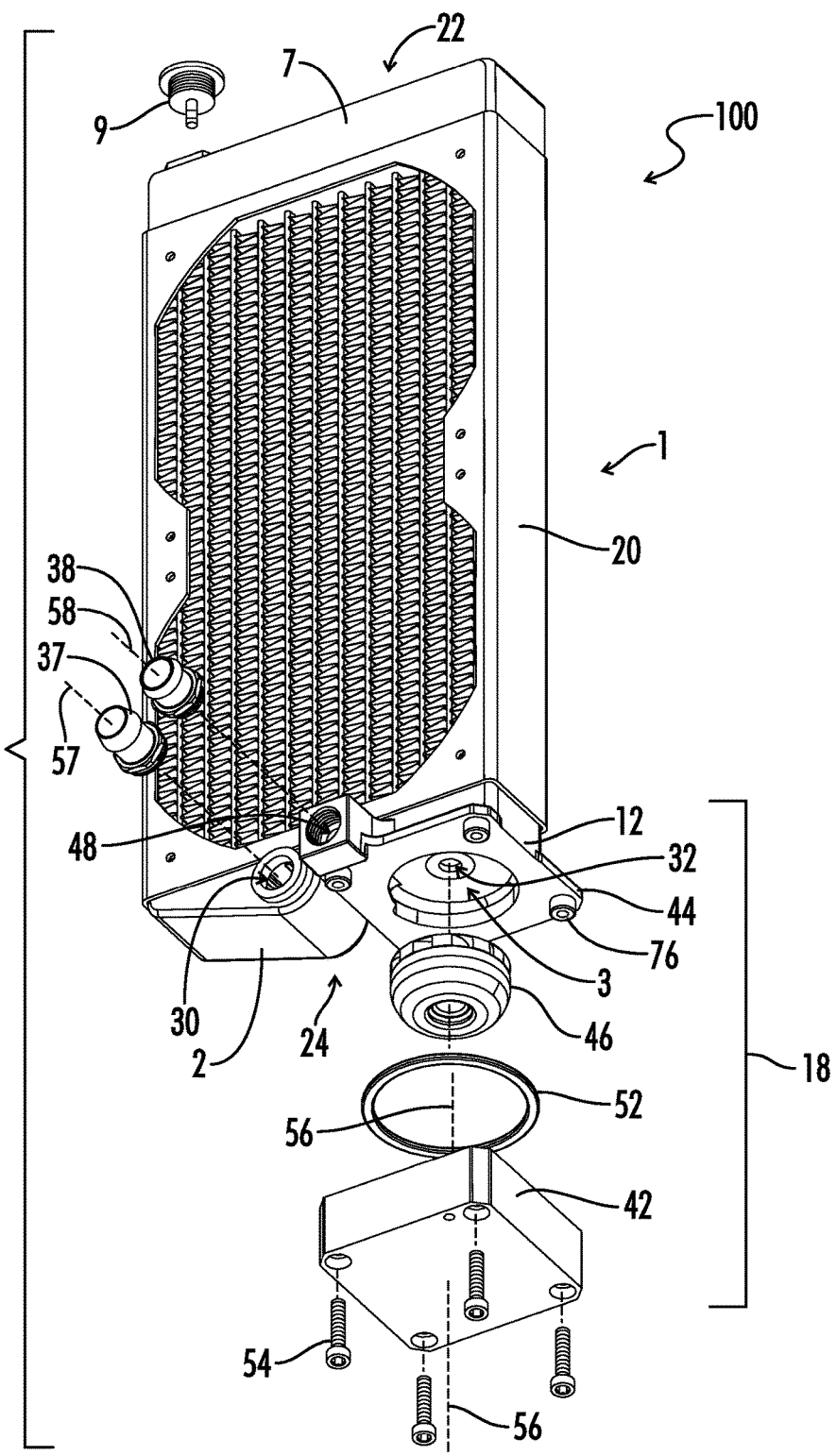
FIG. 1 illustrates a partially exploded perspective view of an embodiment of an integrated cooling apparatus with a radiator and an integrated pump in accordance with the present invention.

Referring now to the drawings and particularly to FIG. 1, an integrated cooling apparatus for actively cooling one or more circuit components on an electronic device using a liquid coolant is generally illustrated in a partially exploded perspective view and is designated by the numeral 100. In the drawings, not all reference numbers are included in each drawing, for the sake of clarity. In addition, positional terms such as "upper," "lower," "side," "top," "bottom," "vertical," "horizontal," etc. refer to the apparatus when in the orientation shown in the drawing. The skilled artisan will recognize that cooling systems and components in accordance with the present disclosure can assume different orientations when in use.

Figure 2:
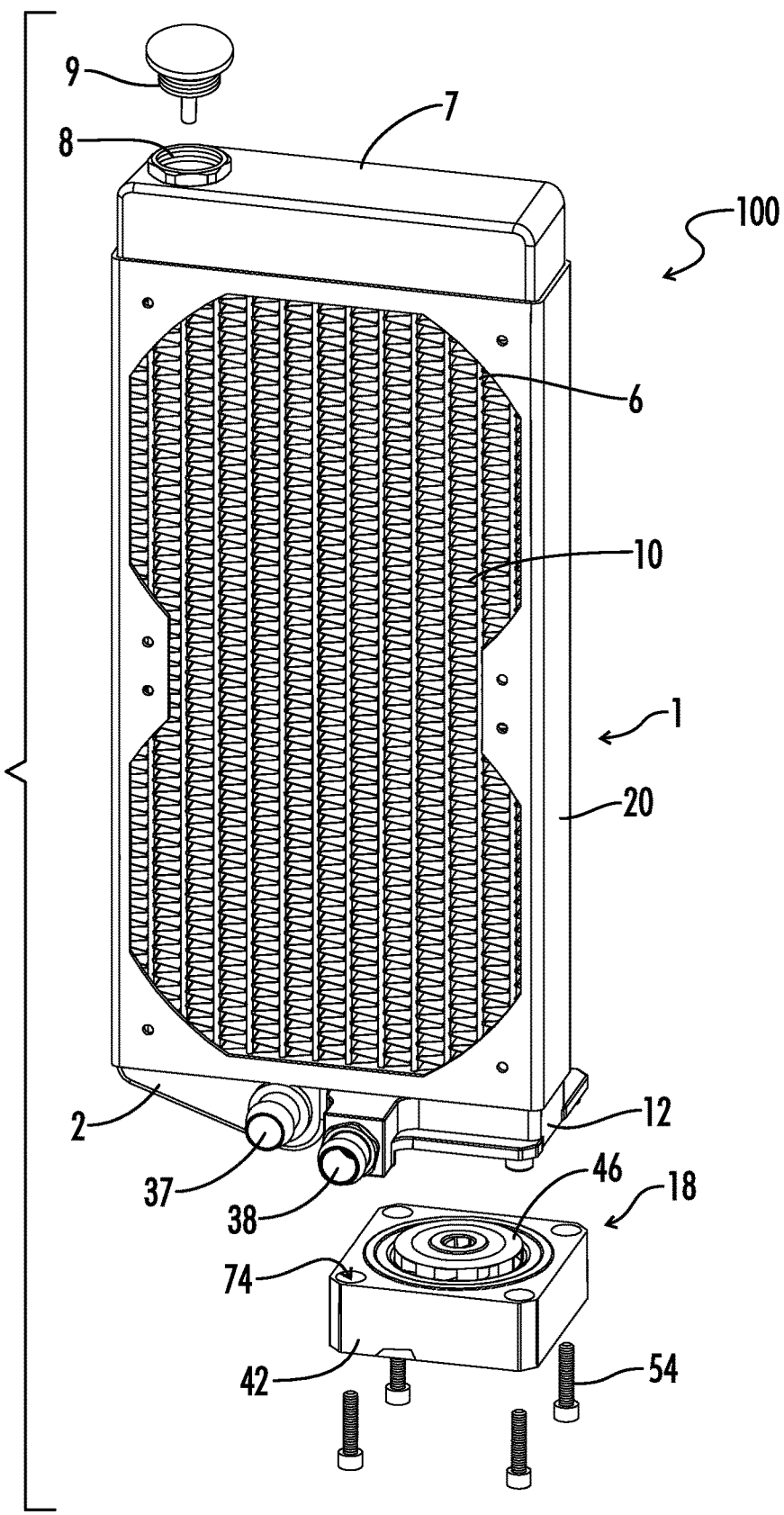
FIG. 2 illustrates a partially exploded perspective view of the embodiment of an integrated cooling apparatus of FIG. 1.
Figure 3:
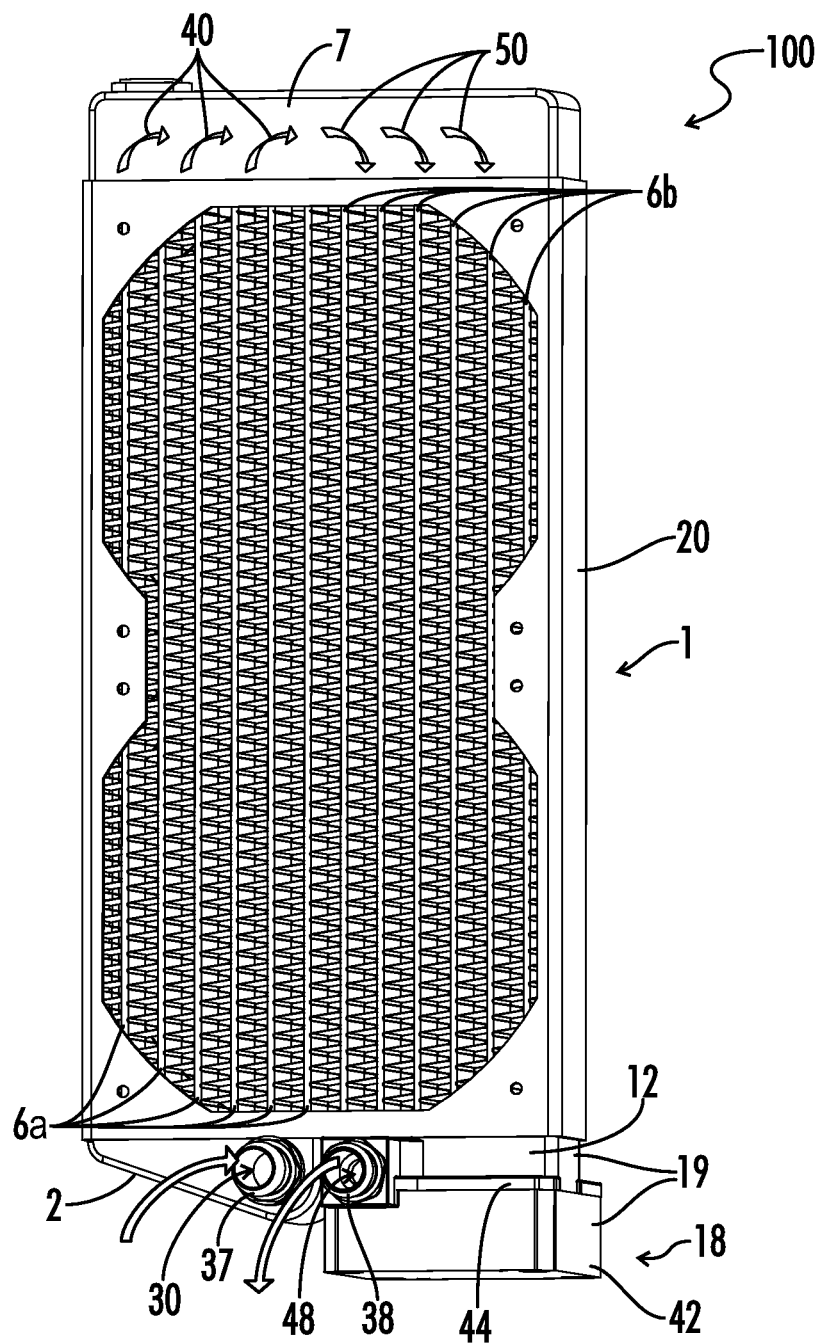
FIG. 3 illustrates a perspective view of the embodiment of the integrated cooling apparatus of FIG. 1.

Referring further to FIGS. 1-3, cooling system 100 includes a radiator 1 and an integrated pump 18. Pump 18 is said to be integrated because radiator 1 and pump 18 together form a one-piece unit that can be attached to or removed from an electronic device, such as a computer, using one or more mechanical fasteners. Radiator 1, along with integrated pump 18, thus forms an integrated cooling system that includes a plug-and-play functionality with a variety of models of external cooling blocks for electronic device cooling applications. For example, various conventional external liquid cooling blocks, cooling plates or liquid heat exchangers can be mounted on the electronic component or components to be cooled. Such conventional cooling blocks or cooling plates can be interchangeably connected to integrated cooling apparatus 100 of the present invention because radiator 1 and integrated pump 18 are provided as a single unit.

Figure 4:
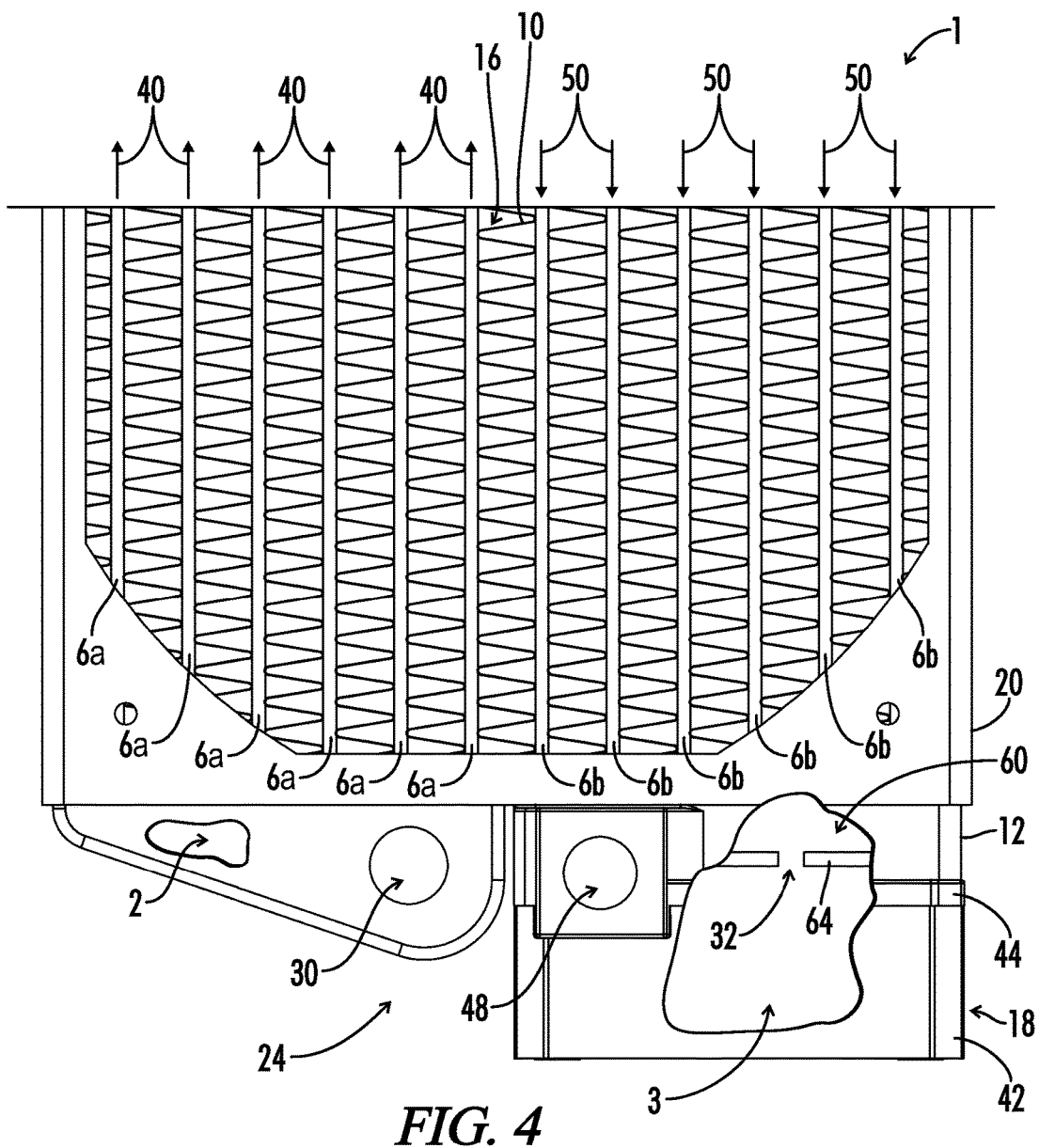
FIG. 4 illustrates a partially broken away front elevation view of an embodiment of an integrated cooling apparatus including a radiator and integrated pump housing in accordance with the present invention.

As seen in FIG. 4, radiator 1 includes a radiator housing 20 having one or more first longitudinal tubes 6a and one or more second longitudinal tubes 6b. Tubes 6a and 6b are said to be longitudinal because each tube generally defines a tube aspect ratio wherein the tube length is greater than the tube diameter. The number of first longitudinal tubes 6a and the number of second longitudinal tubes 6b can be varied depending on several factors, including for example but not limited to the required level of heat extraction, the performance characteristics of pump 18 and the available space on the electronic device for mounting radiator 1. In some embodiments, radiator 1 includes a first plurality of longitudinal tubes 6a and a second plurality of longitudinal tubes 6b, as seen in FIG. 4. In other embodiments, radiator 1 includes only one first longitudinal tube 6a and only one second longitudinal tube 6b to minimize radiator profile (not shown). Referring further to FIG. 4, in some embodiments, radiator 1 includes five or more first longitudinal tubes 6a and five or more second longitudinal tubes 6b.

A tube gap 16 is defined between at least one first longitudinal tube 6a and at least one second longitudinal tube 6b. One or more heat exchanger fins 10 are transversely disposed across tube gap 16 between the adjacent longitudinal tubes. Each heat exchanger fin 10, as seen in FIG. 4, can be positioned at an angle relative to adjacent tubes. Each heat exchanger fin 10 generally spans the tube gap between adjacent tubes so that air or another gas can be passed through radiator 1 across the surfaces of heat exchanger fins 10 and tubes 6a, 6b for convecting heat away from radiator 1.

Figure 9:
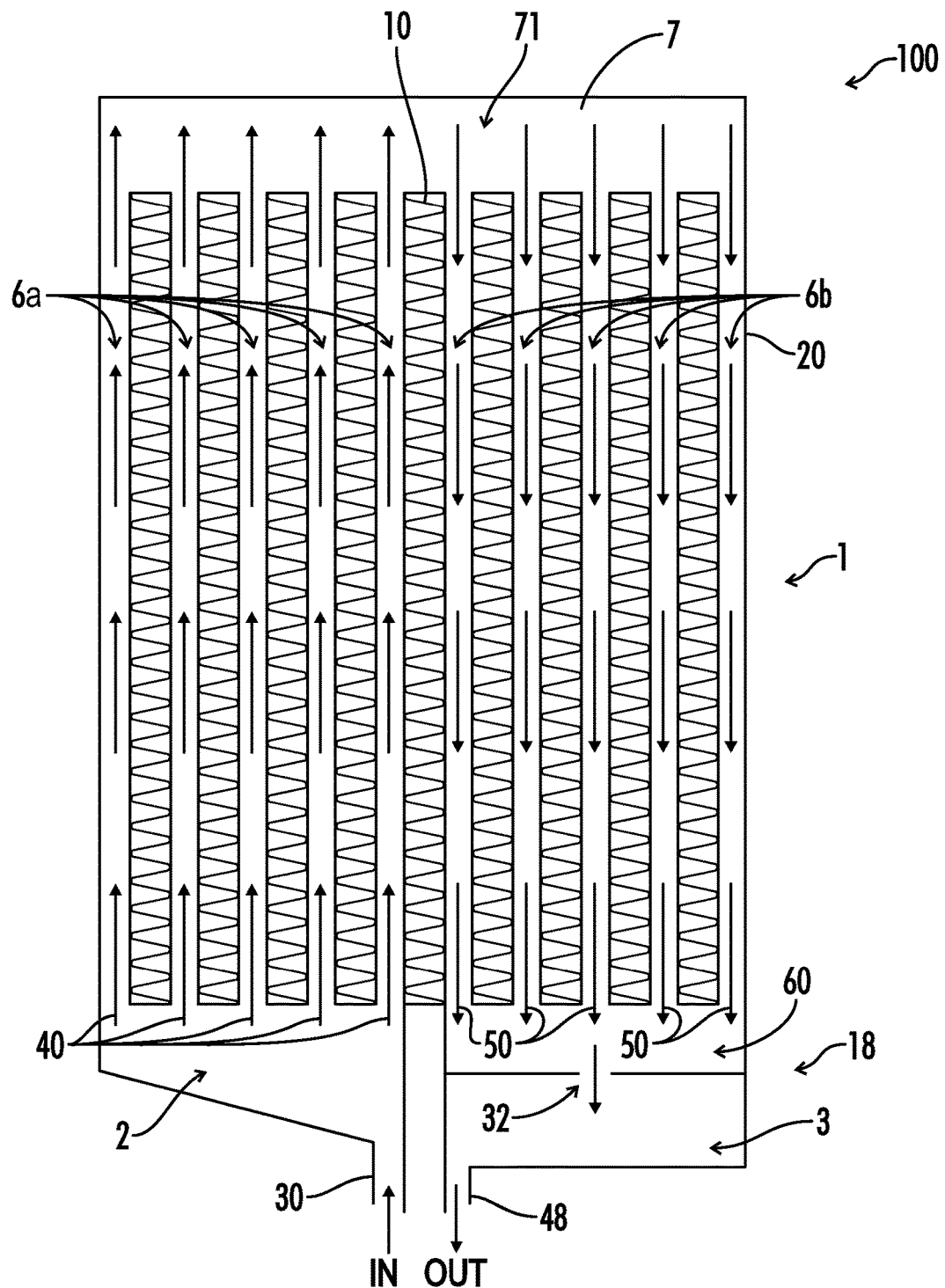
FIG. 9 illustrates a schematic cross-sectional view of an exemplary embodiment of an integrated cooling system in accordance with the present invention.

As seen in FIG. 4 and FIG. 9, in some embodiments, each first longitudinal tube 6a includes a first flow direction 40, and each second longitudinal tube 6b includes a second flow direction 50. The flow directions 40 and 50 generally indicate the direction that a liquid coolant will travel through each respective tube. For example, in some embodiments, liquid coolant travelling through one or more first longitudinal tubes 6a will travel away from the inlet port 30 positioned on the bottom end 24 of radiator 1. Also, liquid coolant travelling through one or more second longitudinal tubes 6b will travel generally toward flow outlet 48, also positioned on the bottom end 24 of radiator 1. Thus, in some embodiments, the first and second flow directions 40, 50 are substantially opposite.

Referring again to FIGS. 1-3, radiator 1 includes a flow inlet 30 and a flow outlet 48. Flow inlet 30 is generally defined as an orifice through which a gas or a fluid can pass to enter apparatus 100. Similarly, flow outlet 48 is generally defined as an orifice through which a gas or a fluid can pass to exit apparatus 100. As seen in FIG. 1, an inlet fitting 37 can be coupled to flow inlet 30, and an outlet fitting 38 can be coupled to flow outlet 48. In some embodiments, inlet fitting 37 and outlet fitting 38 each include a barbed hose connector with a threaded stem, and each fitting 37, 38 threadedly engages its corresponding orifice 30, 48, respectively. During use, an inlet hose or conduit can be secured to inlet fitting 37 for delivering fluid into the cooling system 100, and an outlet hose or conduit can be secured to outlet fitting 38 for delivering fluid from the heat exchanger to the cooling block or heat exchanger engaging the component to be cooled in thermal contact.

In some embodiments, radiator housing 20 includes a first, or upper end 22, and a second, or lower end 24. In some embodiments, the flow inlet 30 and the flow outlet 48 are both positioned on the same end of heat exchanger body 20. As seen in FIG. 1, in one embodiment, flow inlet 30 and flow outlet 48 are both positioned on the lower end 24 of heat exchanger body 20. As such, liquid coolant entering flow inlet 30 passes generally up through heat exchanger body 20 toward upper end 22 and subsequently changes directions in plenum 7 before passing back down toward lower end 24 to exit through flow outlet 48. In embodiments where flow inlet 30 and flow outlet 48 are positioned on the same end of cooling apparatus 100, management of fluid hoses is improved over conventional designs as inlet and exit hoses are positioned spatially near each other.

Liquid coolant is forced through integrated cooling system 100 by a mechanical pump 18 attached to radiator 1. Pump 18 includes a pump housing 19. The pump housing 19 in some embodiments includes an upper pump housing member 12 and a lower pump housing member 42. The lower pump housing member 42 can be detachably securable to upper pump housing member 12. For example, in some embodiments, one or more pump housing fasteners 54 can be used to detachably secure lower pump housing member 42 to upper pump housing member 12. Each pump housing fastener 54 in some embodiments include a socket head cap screw. Additionally, an O-ring can be positioned between upper and lower pump housing members 12, 42 for providing a watertight seal between upper and lower pump housing members 12, 42.

Figure 5:
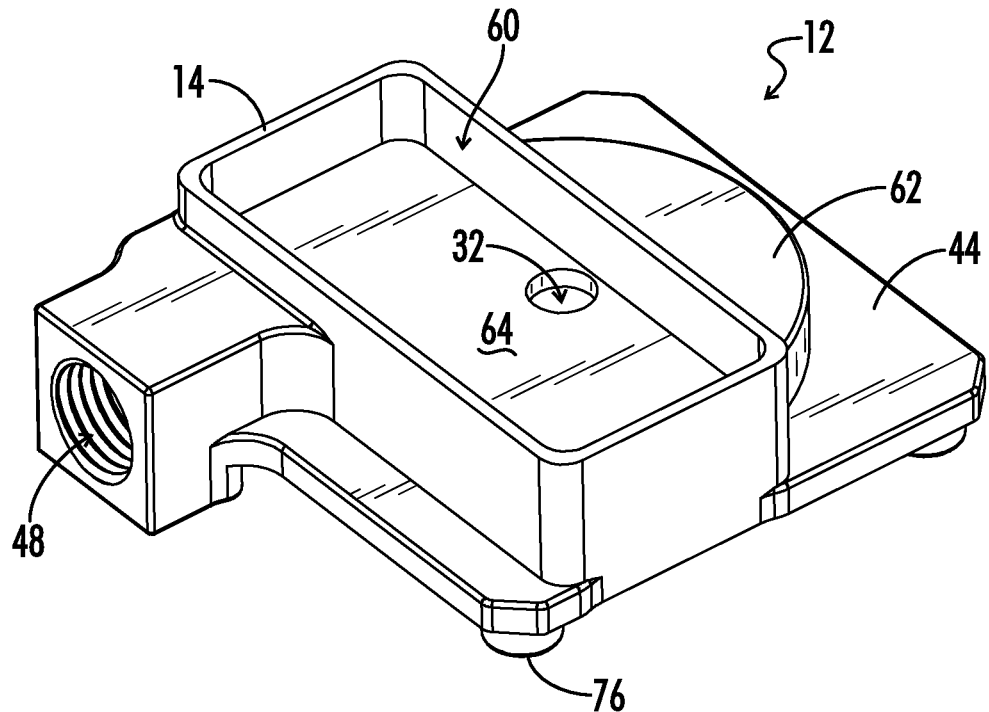
FIG. 5 illustrates a top perspective view of an embodiment of an upper pump housing member of an integrated cooling apparatus in accordance with the present invention.
Figure 6:
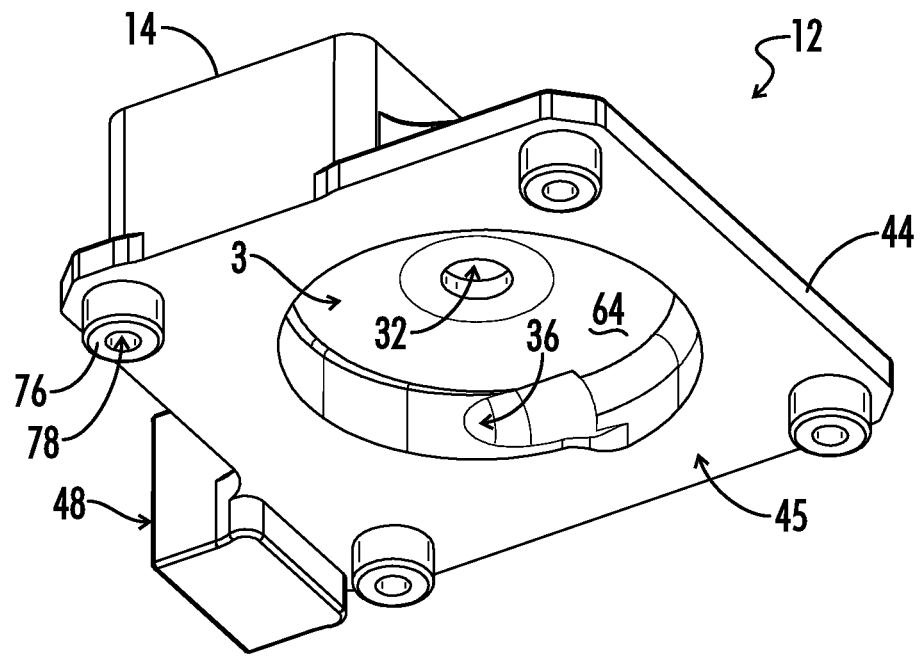
FIG. 6 illustrates a bottom perspective view of the embodiment of an upper pump housing member of FIG. 5.

Referring to FIG. 5 and FIG. 6, an exemplary embodiment of an upper pump housing member 12 is generally illustrated. Upper pump housing member 12 can be integrally formed on radiator 1 including radiator housing 20. Upper pump housing member 12 in other embodiments can be formed separately using a forging, casting, machining, molding or another suitable manufacturing technique and can be subsequently attached to radiator 1. Upper pump housing member 12 can include a metal, plastic, ceramic or other suitable rigid material. Preferably, upper pump housing member 12 includes a nonreactive and noncorrosive material that will not chemically react or corrode when exposed to a liquid coolant such as water or ethylene glycol. Upper pump housing member 12 includes a housing wall 14 that extends generally upward from top 62 of upper pump housing member 12. Housing wall 14 defines a collection reservoir 60 that is positioned on radiator 1 to receive liquid coolant exiting one or more of the plurality of second longitudinal tubes 6b. Housing wall 14 can be integrally formed on radiator 1 or can be attached to radiator 1 using a weld or using another suitable mechanical fastening means. Upper pump housing member 12 also includes a lateral plate 44 extending substantially horizontally from upper pump housing member 12. Plate 44 generally includes a bottom plate surface 45 shaped for engaging lower pump housing member 42. Plate 44 can include a plurality of pilot studs 76 protruding downward from plate 44. Each pilot stud 76 is positioned to engage a corresponding pilot hole 74 defined in lower pump housing member 42, seen in FIG. 2. In some embodiments, one or more pilot studs 76 can define a stud passage 78. Each stud passage 78 can be shaped to receive a pump housing fastener 54. In some embodiments, each stud passage 78 includes a threaded region for threadedly engaging a corresponding threaded region on a pump housing fastener 54. Also seen in FIG. 5, upper pump housing member 12 in some embodiments includes outlet port 48. Outlet port 48 is generally not open to collection reservoir 60 on upper pump housing member 12. Instead, in some embodiments, outlet port 48 is open to an outlet chamber 3 positioned below collection reservoir 60, seen in FIG. 6, via centrifugal exit port 36. In some embodiments, outlet chamber 3 includes a circular shape for allowing a pump impeller, or rotor 46, to rotate inside outlet chamber 3. Centrifugal exit port 36 is aligned substantially tangential to the circular profile of outlet chamber 3 in some embodiments to provide flow of liquid coolant from outlet chamber 3 as pump rotor 46 rotates.

A reservoir wall 64 spans the bottom of collection reservoir 60 and separates collection reservoir 60 from outlet chamber 3, as seen in FIGS. 4-6. Reservoir wall 64 includes an internal exit port 32 that defines a passage for liquid coolant to travel between collection reservoir 60 and second chamber 3, allowing liquid coolant to be engaged by pump rotor 46 and moved out of the pump housing 19 through both centrifugal exit port 36 and outlet port 48. As pump rotor 46 spins and forces liquid coolant through outlet port 48, a negative pressure is created in outlet chamber 3 that pulls additional liquid coolant through exit port 36 from collection reservoir 60. Collection reservoir 60 receives liquid coolant from one or more second longitudinal tubes 6b and generally maintains a fluid volume of liquid coolant housed in collection reservoir 60 during use.

Referring again to FIG. 1 and FIG. 2, in some embodiments, pump rotor 46 is generally included in the pump housing 19 between upper pump housing member 12 and lower pump housing member 42. Pump rotor 46 generally defines a rotor axis of rotation 56 about which pump rotor 46 rotates during use. In some embodiments, rotor axis of rotation 56 is substantially parallel to the second flow direction 50 of liquid coolant passing through one or more second longitudinal tubes 6b, seen in FIG. 4 and FIG. 9. In such embodiments, liquid coolant can be ejected from cooling apparatus 100 along flow exit axis 58. Additionally, liquid coolant can be received into cooling apparatus 100 along flow entrance axis 57. In some embodiments, flow exit axis 58 is substantially perpendicular to the rotor axis of rotation 56. Additionally, in some embodiments, flow exit axis 58 is substantially perpendicular to second flow direction 50, and flow entrance axis 57 is substantially perpendicular to first flow direction 40.

Also seen in FIGS. 1-4 and FIGS. 7-11, in some embodiments, a plenum 7 is disposed on radiator 1. More particularly, plenum 7 can be positioned on radiator housing 20 and can form a plenum cavity, or a reservoir 71, seen for example in FIG. 8, for storing liquid coolant contained in radiator 1. As seen in FIG. 9, in some embodiments, the first plurality of longitudinal tubes 6a is positioned to deliver liquid coolant into the reservoir defined by plenum 7. Also, the second plurality of longitudinal tubes 6b is positioned to receive liquid coolant from the reservoir defined by plenum 7. Thus, liquid coolant enters plenum 7 from one or more first longitudinal tubes 6a, as indicated by arrows 40, and exits plenum 7 through one or more second longitudinal tubes 6b, as indicated by arrows 50.

Figure 10:
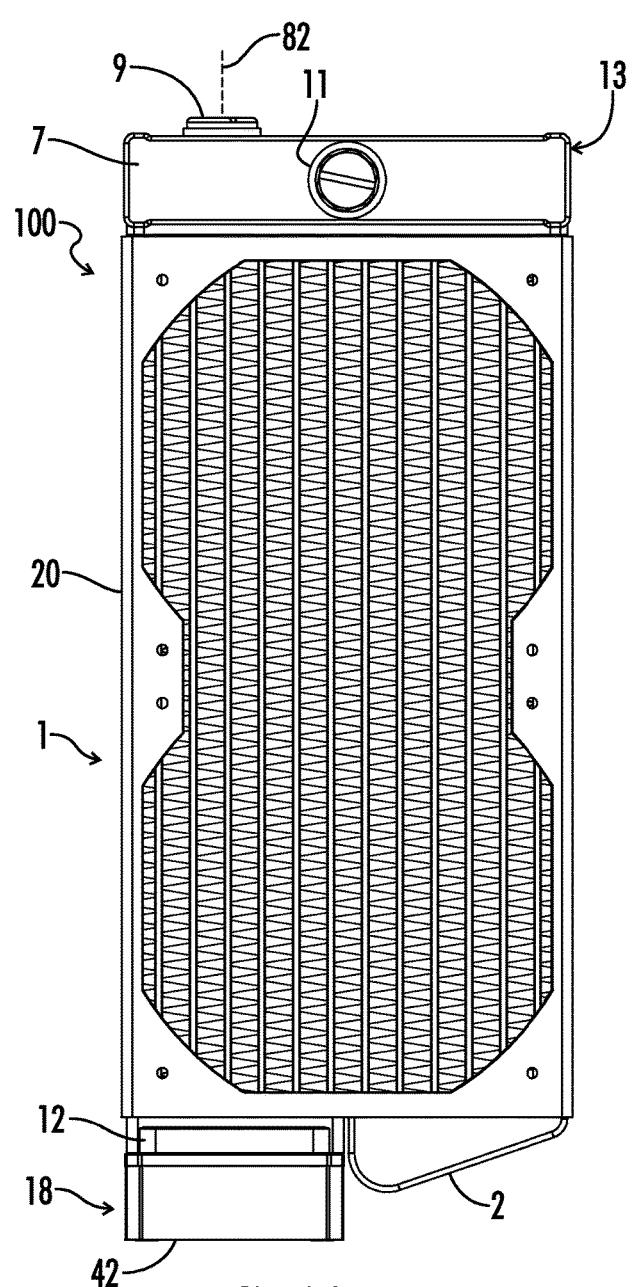
FIG. 10 illustrates a back elevation view of an embodiment of an integrated cooling apparatus having an extended plenum section in accordance with the present invention.
Figure 11:
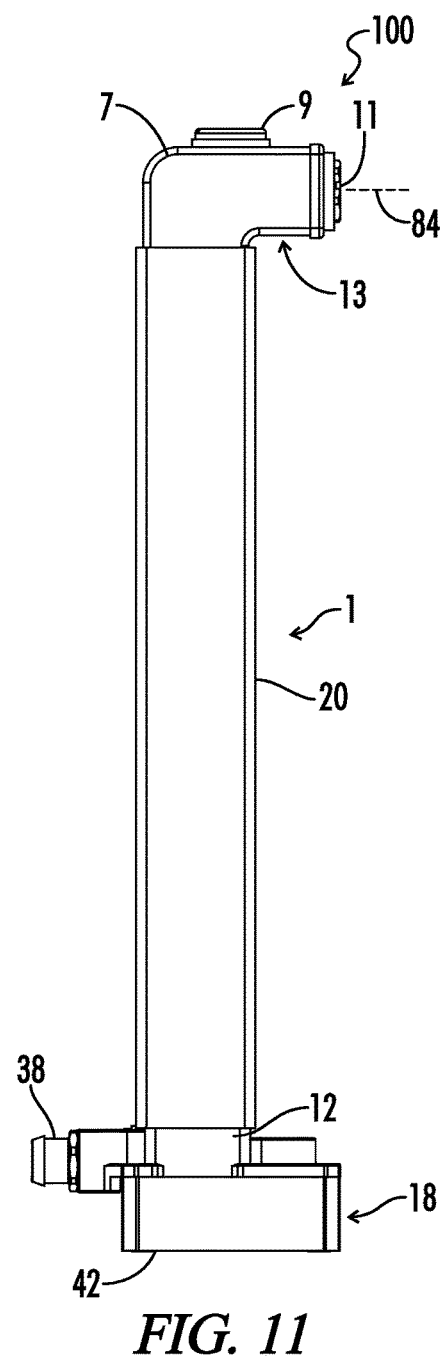
FIG. 11 illustrates a side elevation view of the embodiment of an integrated cooling apparatus of FIG. 10.

Also, as seen in FIG. 1 and FIG. 2, in some embodiments, a fill cap 9 is removably disposed in a fill cap socket 8. Fill cap socket 8 is defined in plenum 7. Fill cap socket 8 can be defined in the top end 22 of cooling apparatus 100. Fill cap 9 can be selectively removed from fill cap socket 8 for adding liquid coolant to, or for removing liquid coolant from, reservoir 1. Referring now to FIG. 10 and FIG. 11, in some embodiments, plenum 7 can include an extended plenum region 13 extending horizontally from plenum 7. Extended plenum region 13 in some embodiments extends substantially perpendicular to first and second flow directions 40, 50. Extended plenum region 13 in some embodiments defines a second fill cap socket. An auxiliary fill cap 11 can be selectively disposed in the second fill cap socket. As such, plenum 7 includes two sockets through which liquid coolant can be added to or removed from radiator 1. Also, as seen in FIG. 10 and FIG. 11, first fill cap 9 is generally rotated about a first fill cap axis 82, and second fill cap 11 is generally rotated about a second fill cap axis 84. In some embodiments, first and second fill cap axes 82, 84 are not parallel. In additional embodiments, first and second fill cap axes 82, 84 are substantially perpendicular.

Referring again to FIG. 1, in some embodiments, an inlet chamber 2 is defined in cooling apparatus 100 between flow inlet 30 and one or more of first longitudinal tubes 6a. Inlet chamber can include a cavity defined on the interior of radiator 1 positioned for receiving a volume of liquid coolant after the liquid coolant enters inlet port 30. During use, the liquid coolant enters inlet chamber 2 and passes through inlet chamber 2 before entering one or more of first longitudinal tubes 6a.

Referring now to FIG. 8, in some embodiments, a cooling apparatus 100 includes a radiator 1 with integrated pump 18 having a width A and a height B. In some embodiments, B is greater than A so that the heat transfer performance characteristics of radiator 1 are achieved while simultaneously allowing cooling apparatus 100 to be mounted on a computer chassis or electronic device. In other embodiments, the ratio of A divided by B is between about 0.1 and about 0.9. In further embodiments, desired heat transfer and form factor characteristics are achieved by providing a ratio of A divided by B between about 0.2 and about 0.4.

A further embodiment of the present invention provides a method of cooling an electronic device, including the steps of: (a) providing an active cooling system having a radiator and an integrated pump attached to the radiator; (b) passing heated liquid into the radiator through a flow inlet; (c) forcing the liquid through a first longitudinal tube in a first flow direction away from the flow inlet; (d) passing the liquid through a plenum disposed on the end of the radiator opposite the flow inlet; (e) forcing the liquid through a second longitudinal tube in a second flow direction opposite the first flow direction; (f) collecting the liquid in a collection reservoir interior to the radiator; (g) passing the liquid through an exit port in the collection reservoir to an outlet chamber; (h) ejecting the liquid from the outlet chamber using a mechanical pump.

Thus, although there have been described particular embodiments of the present invention of a new and useful Radiator With Integrated Pump For Actively Cooling Electronic Devices, it is not intended that such references be construed as limitations upon the scope of the invention except as set forth in the following claims.

What is claimed is:

1. A cooling apparatus, comprising:
   a radiator having a first longitudinal tube with a first flow direction and a second longitudinal tube with a second flow direction opposite the first flow direction;
   a flow inlet port in fluid communication with the first longitudinal tube and positioned proximate a first end of the radiator;
   a flow outlet port positioned proximate the first end of the radiator;
   a collection reservoir in fluid communication with the second longitudinal tube; and
   a pump comprising a lower pump housing detachably coupled to an upper pump housing, the upper pump housing comprising:
      a reservoir wall defining an internal exit passage and a first recess configured to receive at least a first portion of the pump rotor;
      an outlet chamber positioned proximate the reservoir wall and opposite the collection reservoir relative to the reservoir wall, wherein the outlet chamber and the collection reservoir are in fluid communication via the internal exit port and wherein the outlet chamber is substantially circular;
      an exit port in fluid communication with the outlet chamber and the flow outlet port and positioned opposite the collection reservoir relative to the reservoir wall, wherein the exit port is aligned substantially tangential to the outlet chamber; and
      a lateral plate coupled to the reservoir wall and configured to receive the lower pump housing member;
   wherein the lower pump housing member defines a recess configured to receive at least a second portion of the pump rotor such that the pump rotor is disposed between lower pump housing member and the upper pump housing member when the lower pump housing member is coupled to the upper pump housing member; and
   wherein the pump is coupled to the radiator.

2. The cooling apparatus of claim 1, further comprising heat exchanger fins disposed between the first longitudinal tube and the second longitudinal tube.

3. The cooling apparatus of claim 1, further comprising a plenum disposed in fluid communication with and disposed between the first longitudinal tube and the second longitudinal tube.

4. The cooling apparatus of claim 1, wherein the lateral plate is substantially planar.

5. The cooling apparatus of claim 1, further comprising a housing wall extending from the reservoir wall.

6. The cooling apparatus of claim 5, wherein the lateral plate extends substantially perpendicularly from the housing wall.

7. The cooling apparatus of claim 5, wherein the housing wall defines the collection chamber.

8. The cooling apparatus of claim 5, wherein the housing wall is integrally formed on the radiator.

9. The cooling apparatus of claim 1, wherein the upper pump housing member is integrally formed on the radiator.

10. The cooling apparatus of claim 1, wherein the upper pump housing member is detachably coupled to the radiator.

11. The cooling apparatus of claim 1, further comprising a rotor axis, wherein the pump rotor is configured to rotate about the rotor.

12. The cooling apparatus of claim 11, wherein the rotor axis is substantially parallel to the second flow direction.

13. The cooling apparatus of claim 12, further comprising a flow exit axis, wherein the exit port is disposed about the flow exit axis and wherein the flow exit axis is substantially perpendicular relative to the second flow direction.

14. The cooling apparatus of claim 11, further comprising a flow entrance axis, wherein the flow inlet port is disposed about the flow entrance axis and wherein the flow inlet axis is substantially perpendicular relative to the first flow direction.

15. A cooling apparatus, comprising:
   a radiator having a first longitudinal tube with a first flow direction and a second longitudinal tube with a second flow direction opposite the first flow direction;
   a flow inlet port in fluid communication with the first longitudinal tube and positioned proximate a first end of the radiator;
   a flow outlet port positioned proximate the first end of the radiator; and
   a pump comprising a lower pump housing detachably coupled to an upper pump housing, the upper pump housing comprising:
      a housing wall defining a collection reservoir, wherein the collection reservoir is in fluid communication with the second longitudinal tube;
      a reservoir wall spanning the housing wall and defining an internal exit passage;
      an outlet chamber positioned opposite the collection reservoir relative to the reservoir wall, wherein the outlet chamber and the collection reservoir are in fluid communication via the internal exit port;
      a centrifugal exit port in fluid communication with the outlet chamber and the flow outlet port and positioned opposite the collection reservoir relative to the reservoir wall; and
      a lateral plate extending substantially perpendicularly from the housing wall and configured to receive the lower pump housing member;
   wherein the lower pump housing member defines a recess configured to receive at least a portion of a pump rotor such that the pump rotor is disposed between lower pump housing member and the upper pump housing member when the lower pump housing member is coupled to the upper pump housing member; and
   wherein the pump is coupled to the radiator.

16. The cooling apparatus of claim 15, wherein the housing wall is integrally formed on the radiator.

17. The cooling apparatus of claim 16, wherein the upper pump housing member is detachably coupled to the radiator.

18. The cooling apparatus of claim 15, wherein the outlet chamber is circular.

19. The cooling apparatus of claim 18, wherein the exit port is aligned substantially tangential to the outlet chamber.

20. A method of cooling an electronic device, comprising:
   coupling a cooling apparatus to an electronic device, wherein the cooling apparatus comprises a radiator coupled to a pump;
   passing a liquid coolant through a flow inlet port disposed about a flow entrance axis, wherein the flow inlet is port is in fluid communication with a first longitudinal tube with a first flow direction substantially perpendicular to the flow entrance axis;
   exchanging the liquid coolant from the first longitudinal tube to a second longitudinal tube via a plenum, wherein the second longitudinal tube has a second flow direction opposite the first flow direction, wherein the first longitudinal tube and the second longitudinal tube are disposed within the radiator such that a heat transfer occurs between the electronic device and the liquid coolant;
   receiving the liquid coolant into a collection reservoir formed by a housing wall, wherein a reservoir wall spans the housing wall and defines an internal exit port;
   passing the liquid coolant into an outlet chamber via the internal exit port, wherein the outlet chamber is positioned opposite the collection reservoir relative to the reservoir wall;
   forcing the liquid coolant from the outlet chamber through an exit port disposed about a flow exit axis, wherein a pump rotor is disposed between a lower housing member defining a recess, the recess configured to receive the pump rotor, and a lateral plate extending from the housing wall and wherein the pump rotor rotates about a rotor axis that is substantially perpendicular to the flow exit axis and substantially parallel to the second flow direction; and
   ejecting the liquid coolant from the cooling apparatus via a flow outlet port in fluid communication with the exit port, wherein the flow outlet port is positioned proximate the flow inlet port on a first side of the cooling device.

* * * * *